(12) United States Patent
Shin

(10) Patent No.: US 7,750,554 B2
(45) Date of Patent: Jul. 6, 2010

(54) MULTILAYERED ELECTRODE AND ORGANIC LIGHT EMITTING DIODE HAVING THE SAME

(75) Inventor: Hyun-Eok Shin, Kyunggi-do (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 1142 days.

(21) Appl. No.: 11/244,384

(22) Filed: Oct. 6, 2005

(65) Prior Publication Data

US 2006/0091791 A1 May 4, 2006

(30) Foreign Application Priority Data

Oct. 28, 2004 (KR) ...................... 10-2004-0086913

(51) Int. Cl.
  *H01J 1/62* (2006.01)
(52) U.S. Cl. ...................................... 313/503; 313/504
(58) Field of Classification Search .................. 313/503, 313/504, 506; 315/169.3, 169.1
  See application file for complete search history.

(56) References Cited

U.S. PATENT DOCUMENTS

| | | | |
|---|---|---|---|
| 6,121,727 A * | 9/2000 | Kanai et al. .................. | 313/504 |
| 6,501,217 B2 * | 12/2002 | Beierlein et al. ............. | 313/504 |
| 2001/0026120 A1 * | 10/2001 | Fukuyoshi et al. .......... | 313/479 |
| 2002/0117962 A1 * | 8/2002 | Beierlein et al. ............. | 313/504 |
| 2003/0180177 A1 * | 9/2003 | Murata ........................ | 420/503 |
| 2003/0234608 A1 | 12/2003 | Lee et al. | |

FOREIGN PATENT DOCUMENTS

| | | |
|---|---|---|
| CN | 1446941 | 10/2003 |
| CN | 1468038 | 1/2004 |
| JP | 11-282383 | 10/1999 |
| JP | 2004-043868 | 2/2004 |
| JP | 2004-165017 | 6/2004 |
| WO | 2004/086531 | 10/2004 |

OTHER PUBLICATIONS

*Office action* from the Chinese Patent Office issued in Applicant's corresponding Chinese Patent Application 200510118422X dated Aug. 8, 2008.
Office action from the Japanese Patent Office issued in Applicant's corresponding Japanese Patent Application No. 2005-311373 dated Nov. 11, 2008.

* cited by examiner

*Primary Examiner*—Joseph L Williams
(74) *Attorney, Agent, or Firm*—Robert E. Bushnell, Esq.

(57) ABSTRACT

An organic light emitting diode, which has a pixel electrode, the pixel electrode constructed with a first layer comprising metal oxide on the substrate; a second layer comprising silver alloyed with at least one metal selected from a group consisting of lanthanide series elements and actinide series elements on the first layer; and a third layer comprising metal oxide on the second layer. As such, there are provided the second layer comprising the silver alloy, and the first and third layer comprising the metal oxide and formed above and below the second layer so that adhesion of a silver alloy (e.g., ATD alloy) may be enhanced, and an anode having enhanced reflectance may also be provided by using silver with increased reflectance.

19 Claims, 4 Drawing Sheets

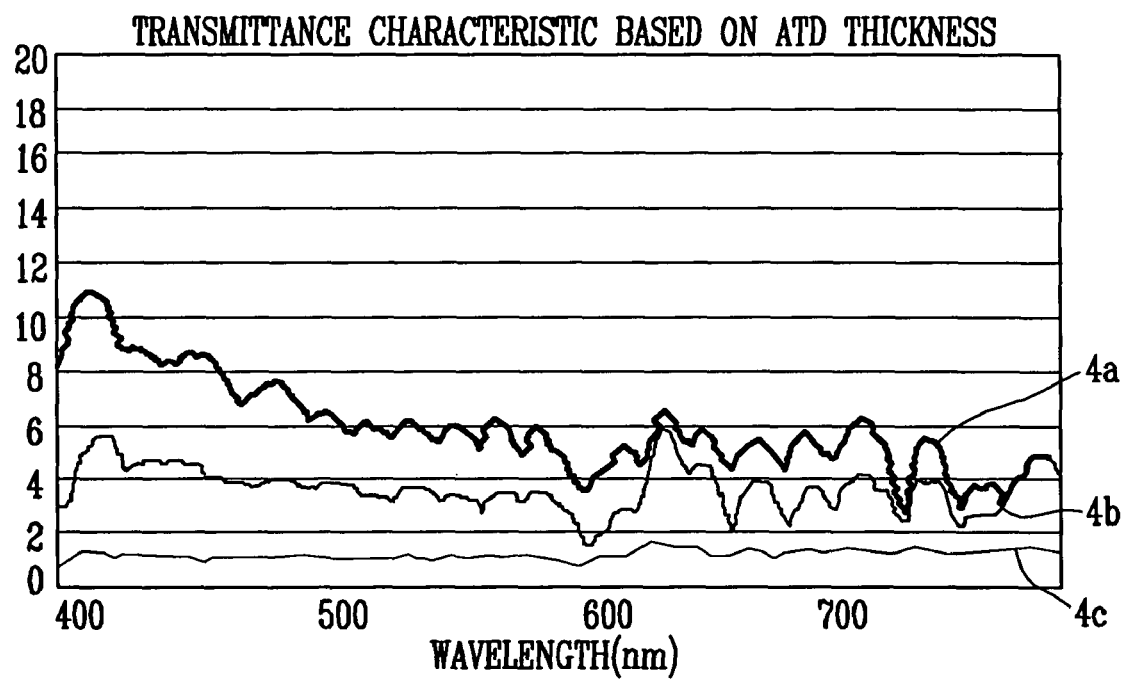

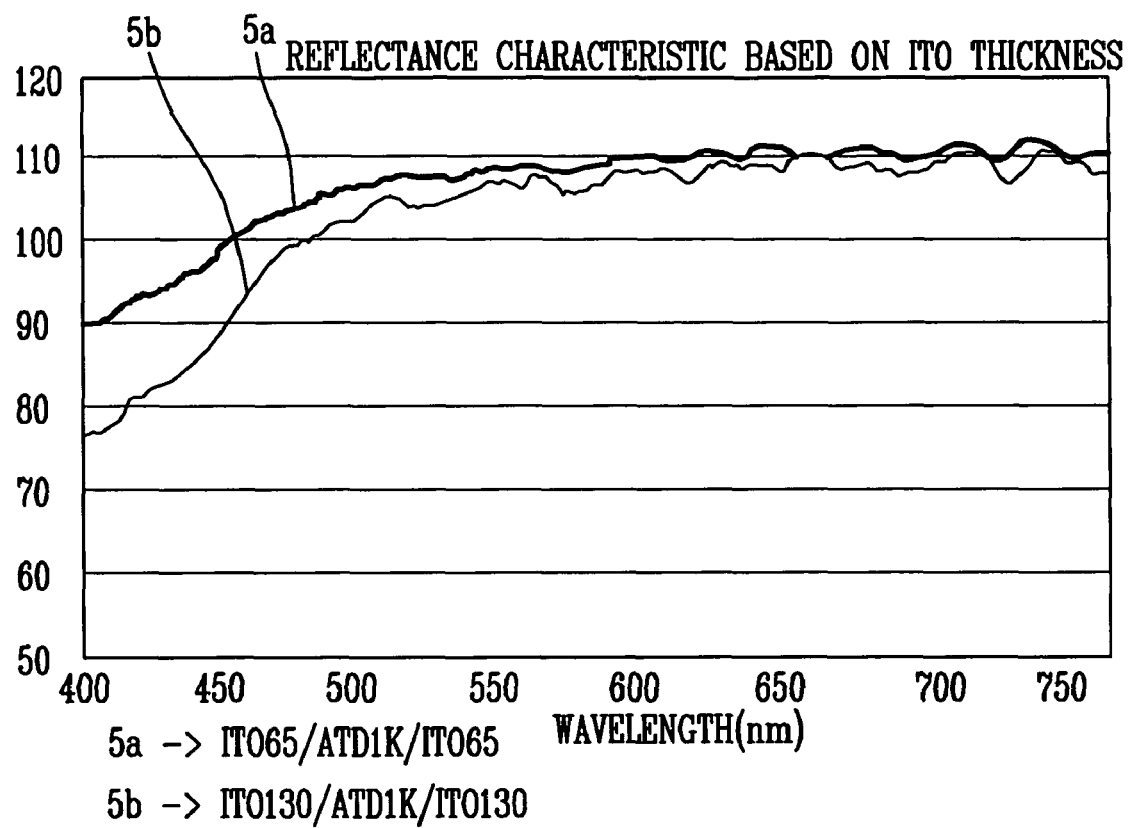

MULTILAYERED ELECTRODE AND ORGANIC LIGHT EMITTING DIODE HAVING THE SAME

CLAIM OF PRIORITY

This application claims priority to and the benefit of Korean Patent Application No. 2004-86913, filed Oct. 28, 2004, the disclosure of which is hereby incorporated herein by reference in its entirety.

BACKGROUND

1. Field of the Invention

The present invention relates to an organic light emitting diode including a pixel electrode formed on a substrate, and more particularly, to an organic light emitting diode improved in adhesion with the substrate and reflectance.

2. Discussion of Related Art

An organic light emitting diode is a diode which generates light using an organic material which emits lights when current flows through electrodes, and typically includes a pair of electrodes composed of a pixel electrode and a counter electrode, and an emission layer. The organic light emitting diode optionally further includes, between the pixel and counter electrodes a hole injection layer (HIL), a hole transport layer (HTL), an electron injection layer (EIL), and an electron transport layer (ETL).

Hereinafter, the conventional organic light emitting diode will be described.

The organic light emitting diode includes a substrate, a pixel electrode (hereinafter, referred to as an "anode") formed on the substrate, an emission layer formed on the anode, and a counter electrode (hereinafter referred to as a "cathode"). The organic light emitting diode optionally further includes a hole injection layer (HIL) and a hole transport layer (HTL) formed on the anode, and an electron transport layer (ETL) and an electron injection layer (EIL) formed on the emission layer. In this case, the anode has a high work function, and is an electrode composed of a single layer formed of transparent and conductive metal oxide such as Indium Tin oxide (ITO) and Indium Zinc Oxide (IZO).

When a voltage is applied between the anode and the cathode in the organic light emitting diode having the above-described structure, holes generated in the anode move to the emission layer through the HIL and the HTL, and electrons generated in the cathode move to the emission layer through the EIL and the ETL. The holes and electrons moved to the emission layer are recombined in the emitting layer to emit the light. The light generated in the emission layer is emitted to the outside through the anode having transparency.

However, the single layer anode has a decreased work function as time progresses, which causes luminous efficiency to be decreased, so that it is not easy to implement colorization or high accuracy which the consumer desires to have. In order to solve the problem of the decreased luminous efficiency caused by the decreased work function, it has been proposed in recent years that silver (Ag) or a silver alloy which has a relatively high reflectance compared to other metals be used to form the anode. The anode using the silver or silver alloy has a relatively high reflectance so that brightness (luminance) of light generated in the emission layer may be further increased.

However, in the process of forming the anode using the silver or silver alloy, an electrically ionized metal may be melted or electro-chemically corroded when the silver or silver alloy is in contact with moisture. In addition, the silver or silver alloy has poor adhesion with a substrate (e.g. a glass substrate), which causes the productivity to be degraded even though it has a relatively high reflectance.

SUMMARY OF THE INVENTION

It is therefore an object of the present invention to provide an improved pixel electrode.

It is also an object of the present invention to provide an improved organic light emitting diode.

The present invention solves aforementioned problems by providing an organic light emitting diode comprising a pixel electrode having a multi-layered structure (i.e. a multilayer pixel electrode) which allows the productivity of the pixel electrode to be enhanced and the reflectance to be improved by fabricating the pixel electrode with a silver alloy having increased adhesion.

In an exemplary embodiment of the present invention, an organic light emitting diode includes a pixel electrode, the pixel electrode comprising: a first layer comprising metal oxide on the substrate; a second layer comprising silver alloy containing silver, at least a first metal selected from a group consisting of the elements of the lanthanide series and the elements of the actinide series on the first layer; and a third layer comprising metal oxide on the second layer.

The silver alloy may further contain at least a second metal selected from the Group 11 elements (IB) of the Periodic Table such as Cu and Au. The first metal may comprise samarium. The samarium may be contained at an atomic percent of 0.1 to 0.6, and the second metal may be contained at an atomic percent of 0.4 to 1. The silver alloy may further contain terbium as the first metal. The terbium may be contained at an atomic percent of 0.4 to 1. Each thickness of the first and third layers may be smaller than the thickness of the second layer, and each of the first and third layers may be formed of one material of Indium Tin Oxide (ITO) and Indium Zinc Oxide (IZO). The organic light emitting diode further includes an emission layer formed on the pixel electrode, and a counter electrode formed on the emission layer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein:

FIG. 4 is a graph showing a transmittance characteristic based on the thickness of a second layer forming the pixel electrode according to an embodiment of the present invention; and FIG. 5 is a graph showing a reflectance characteristic based on the thickness of the first and third layers forming the pixel electrode according to an embodiment of the present invention.

DETAILED DESCRIPTION OF PREFERRED EMBODIMENTS

Figure 1:
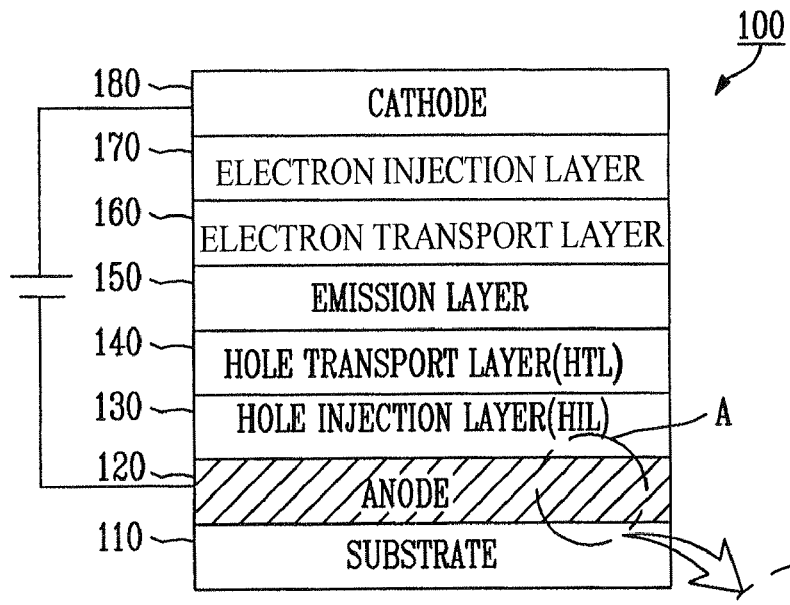
FIG. 1 is a side cross-sectional view schematically illustrating an organic light emitting diode which has a conventional pixel electrode.

FIG. 1 is a side cross-sectional view schematically illustrating an organic light emitting diode including a conventional pixel electrode. Referring to FIG. 1, the organic light emitting diode 100 includes a substrate 110, a pixel electrode 120 (hereinafter, referred to as an "anode") formed on the substrate 110, an emission layer 150 formed on the anode 120, and a counter electrode 180 (hereinafter referred to as a "cathode"). In addition, the organic light emitting diode 100 includes a hole injection layer (HIL) 130 and a hole transport layer (HTL) 140 formed on the anode 120, and an electron transport layer (ETL) 160 and an electron injection layer (EIL) 170 formed on the emission layer 150. In this case, the anode 120 has a high work function, and is an electrode composed of a single layer formed of transparent and conductive metal oxide such as Indium Tin oxide (ITO) and Indium Zinc Oxide (IZO) (see the A region of FIG. 1).

When a voltage is applied between the anode 120 and the cathode 180 in the organic light emitting diode 100 having the above-described structure, holes generated in the anode 120 move to the emission layer 150 through the HIL 130 and the HTL 140, and electrons generated in the cathode 180 move to the emission layer 150 through the EIL 170 and the ETL 160. The holes and electrons moved to the emission layer 150 are recombined in the emitting layer 150 to emit the light. The light generated in the emission layer 150 is emitted to the outside through the anode 120 having transparency.

The single layer anode 120, however, has a decreased work function as time progresses, which causes luminous efficiency to be decreased, so that it is not easy to implement colorization or high accuracy which the consumer desires to have. In order to solve the problem of the decreased luminous efficiency caused by the decreased work function, it has been proposed in recent years that silver (Ag) or a silver alloy which has a relatively high reflectance compared to other metals be used to form the anode. The anode using the silver or silver alloy has a relatively high reflectance so that brightness (luminance) of light generated in the emission layer may be further increased.

In the process of forming the anode using the silver or silver alloy, an electrically ionized metal may be melted or electrochemically corroded when the silver or silver alloy is in contact with moisture. In addition, the silver or silver alloy has poor adhesion with a substrate (e.g. a glass substrate), which causes the productivity to be degraded even though it has a relatively high reflectance.

Hereinafter, the present invention will be described in detail with reference to FIGS. 2 through 5.

Figure 2:
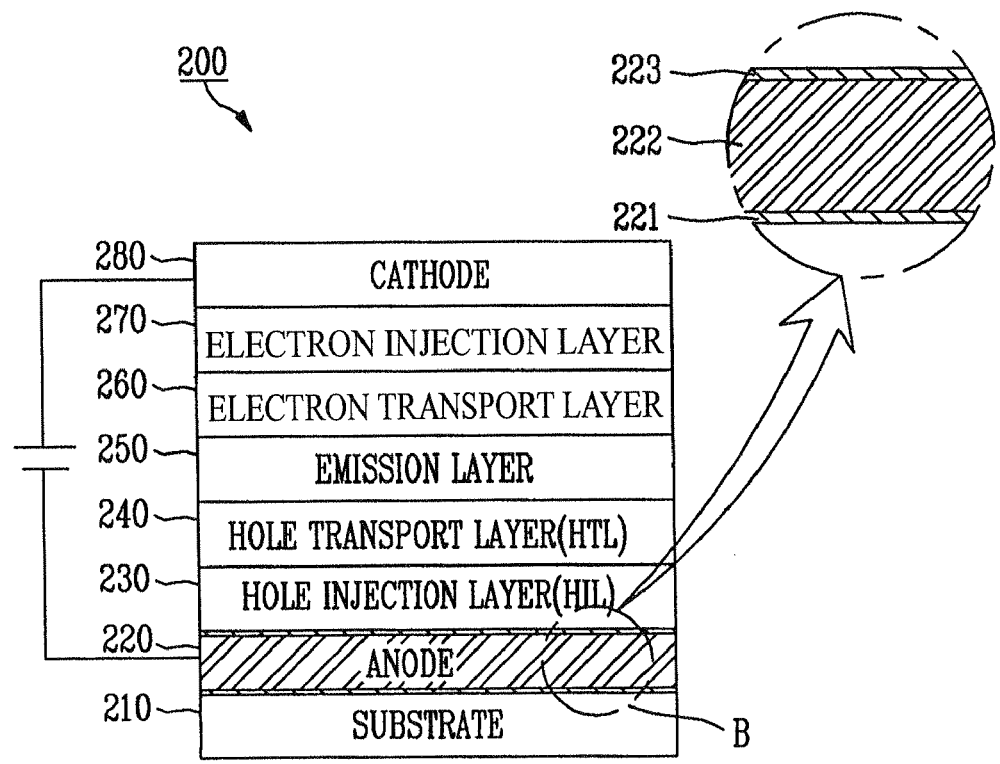
FIG. 2 is a side cross-sectional view schematically illustrating an organic light emitting diode which has a pixel electrode composed of a plurality of layers according to an embodiment of the present invention.

FIG. 2 is a side cross-sectional view schematically illustrating an organic light emitting diode which has a pixel electrode according to an embodiment of the present invention.

Referring to FIG. 2, the organic light emitting diode 200 includes a substrate 210, a pixel electrode 220 (hereinafter, referred to as an "anode") formed on the substrate 210, an HIL 230, an HTL 240, an emission layer 250, an ETL 260, an EIL 270, and a counter electrode 280 (hereinafter, referred to as a "cathode"). For simplicity of description, a principle of emitting light of the organic light emitting diode 200 according to an embodiment of the present invention is equal to that of a conventional organic light emitting diode 100 so that its description will be omitted.

The anode 220 of the organic light emitting diode 200 according to one embodiment of the present invention includes a first layer 221, a second layer 222, and a third layer 223 which are formed on the substrate 210 (see the B region of FIG. 2).

The first layer 221 is formed on the substrate 210 to serve to enhance adhesion between the second layer 222 and the substrate 210, and is formed of transparent and conductive metal oxide such as ITO and IZO. The second layer 222 is formed on the first layer 221, using an alloy containing silver (i.e. a silver alloy). The silver alloy constituting the second layer 222 preferably includes at least one selected from a group consisting of lanthanide series elements, for example, Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Lutetium (Lu) and actinide series elements, for example, Actinium (Ac), Thorium (Th), Protactinium (Pa), Uranium (U), Neptunium (Np), Plutonium (Pu), Americium (Am), Curium (Cm), Berkelium (Bk), Californium (Cf), Einsteinium (Es), Fermium (Fm), Mendelevium (Md), Nobelium (No), Lawrenceium (Lr). At least one metal selected from the Group 11 elements (IB) of the Periodic Table (for example, Au, Cu, and Rg), together with the lanthanide series elements and the actinide series elements, may be further added to the silver alloy which constitutes the second layer 222.

Hereinafter, the silver alloy employed in the present embodiment, that is, the silver alloy in which Sm, Tb, Au, and Cu are contained, is referred to as an ATD alloy. Sm contained in the ATD alloy preferably has an atomic percent of 0.1 to 0.6 and each of Tb, Au, and Cu has an atomic percent of 0.4 to 1. It is preferable to add Sm having an atomic percent of 0.3 to the ATD alloy of the present embodiment. In addition, a thickness of the ATD alloy is 1,000 Å or more, and the more the thickness increases under tolerance of its design process, the better it becomes. This prevents light generated in the emission layer 250 from being lost when the thickness of the ATD alloy increases, which may lead to enhancement of the reflectance.

The third layer 223 is formed on the second layer 222, and is preferably formed on an entire surface of the second layer 222 for uniformity of the whole anode 220. The third layer 223 is not limited to a specific material and, and any material having a sufficient transparency to be used as an electrode may be employed for the third layer. However, the conductive metal oxide such as the material (e.g. ITO and IZO) used for forming the first layer 221 is employed in the present embodiment.

The first layer 221 and the third layer 223 may be formed of the same conductive metal oxide, or may be formed of different materials from each other (for example, the first layer is formed of ITO and the third layer is formed of IZO). In addition, the first and third layers 221 and 223 may be formed of amorphous ITO, and the first and third layers 221 and 223 formed of the amorphous ITO also have good adhesion and thermal characteristics. The first and third layers 221 and 223 are formed to be relatively thin compared to the thickness of the second layer 222 in order to prevent an own color of light generated in the emission layer 250 from being changed. It is disclosed in the present embodiment that the first layer 221 and the third layer 223 are formed to have a thickness of 100 Å or less.

Figure 3:
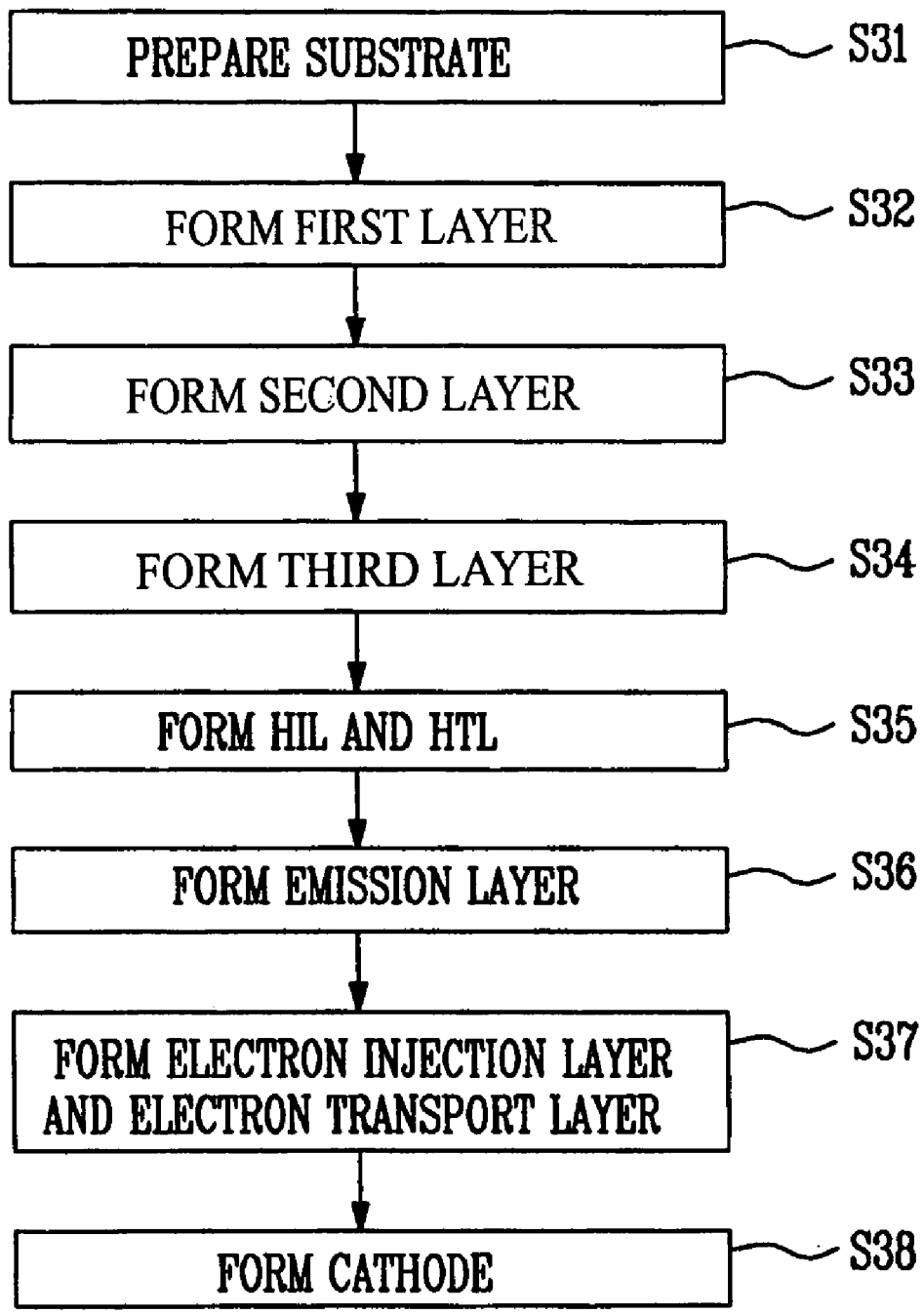
FIG. 3 is a control flow chart schematically illustrating a method of forming the pixel electrode according to an embodiment of the present invention.

FIG. 3 is a block diagram schematically illustrating a method of forming the pixel electrode according to an embodiment of the present invention. Referring to FIG. 3, the method of forming the pixel electrode 220 according to an embodiment of the present invention starts with a step S31 of preparing a substrate 210 formed of glass or organic material. In the next step S32, a first layer 221 is formed on the substrate 210, which is formed of ITO by any deposition process (e.g. a sputtering process). In the next step S33, a second layer 222 is formed on the first layer 221 using an ATD alloy (containing Ag, Sm, Au, Cu, and Tb). The second layer 222 of the present embodiment has a deposition thickness of about 1,000 Å to enhance the reflectance. After the second layer 222 is formed, the third layer 223 using ITO is formed on the second layer 222, (step 34). The third layer 223 has a thickness of about 65 Å in the present embodiment.

After the multilayer anode 220 is formed by the above-described process steps (steps S32 to S34), the HIL 230 and the HTL 240 are formed (step S35), the emission layer 250 on the HIL 230 and the HTL 240 is formed (step S36), the ETL 260 and the EIL 270 on the emission layer 250 are formed (step S37), and the cathode 280 is formed (step S38).

In the above-described embodiment, all of the HTL, the HTL, the EIL, and the ETL are formed. However, these layers may be optionally formed.

FIG. 4 is a graph showing a transmittance characteristic based on the thickness of a second layer forming the pixel electrode according to an embodiment of the present invention. Referring to FIG. 4, three plot lines are illustrated which indicate the transmittance based on the thickness of the second layer 222 having an ATD alloy structure.

In FIG. 4, the plot line 4a shows the transmittance when the thickness of the second layer 222 is 520 Å, the plot line 4b shows the transmittance when the thickness of the second layer 222 is 780 Å, and the plot line 4c shows the transmittance when the thickness of the second layer 222 is 1000 Å. Referring to FIG. 4, it can be seen that the transmittance is decreased when the thickness of the second layer 222 formed of the ATD alloy is increased. That is, in order to reduce the loss of light generated in the emission layer 250, it is preferable to make the second layer 222 thick.

FIG. 5 is a graph showing a reflectance characteristic based on the thickness of the first and third layers 221 and 223 forming the pixel electrode according to an embodiment of the present invention.

In FIG. 5, the plot line 5a shows reflectance when each deposited thickness of the first and third layers 221 and 223 is 65 Å (ITO 65 Å/ATD 1000 Å/ITO 65 Å), and the plot line 5b shows reflectance when each deposited thickness of the lower and third layers 221 and 223 is 130 Å (ITO 130 Å/ATD 1000 Å/ITO 130 Å). Assuming that the thickness of the second layer 222 is constant, the reflectance of the multilayer anode 220 is dependent on the thickness of the first and third layers 221 and 223. To detail this, Referring to the plot lines 5a and 5b, the reflectance of the multilayer anode 220 is better when the wavelength becomes increased and the thickness of the first and third layers 221 and 223 becomes thinner. Accordingly, it is preferable to make the first and third layers thin in order to reduce the change of color tone of the emission layer 250.

According to an embodiment of the present invention as mentioned above, the conductive metal oxide is deposited below and above a second layer to form the first layer and the third layer, so that adhesion of the second layer deposited using an ATD alloy may be enhanced.

Furthermore, when an ITO/ATD/ITO structure is employed for the multilayer anode, an additional adhesive material is not required between the substrate and the multilayer anode, so that productivity of the anode may be enhanced.

In addition, an ATD alloy having good reflectance is employed, so that the reflectance of the anode may be increased and luminance of an emission diode may be enhanced.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. An electrode for an organic light emitting diode, comprising:
    a first layer comprising metal oxide, the first layer having the thickness of not more than 100 Å;
    a second layer formed on the first layer, the second layer comprising silver alloy including silver and at least one first metal selected from a group consisting of the lanthanide series elements and the actinide series elements, the second layer having the thickness of not less than 1,000 Å; and
    a third layer comprising a conducting material on the second layer, the third layer having the thickness of not more than 100 Å.

2. The electrode as claimed in claim 1, wherein the silver alloy further contains at least one second metal selected from the Group 11 elements (IB).

3. The electrode as claimed in claim 1, wherein the silver alloy contains silver, samarium and at least one of Cu and Au.

4. The electrode as claimed in claim 3, wherein the samarium is contained at an atomic percent of 0.1 to 0.6.

5. The electrode as claimed in claim 2, wherein the second metal selected from the Group 11 elements (IB) is contained at an atomic percent of 0.4 to 1.

6. The electrode as claimed in claim 3, wherein the silver alloy further contains terbium.

7. The electrode as claimed in claim 6, wherein the terbium is contained at an atomic percent of 0.4 to 1.

8. The electrode as claimed in claim 1, wherein each thickness of the first layer and the third layer is smaller than the thickness of the second layer.

9. The electrode as claimed in claim 1, wherein each of the first layer and the third layer is formed of one of Indium Tin Oxide (ITO) and Indium Zinc Oxide (IZO).

10. An organic light emitting diode comprising the electrode as claimed in claim 1.

11. An organic light emitting diode, comprising:
    a first electrode comprising:
        a first layer comprising metal oxide, the first layer having the thickness of not more than 100 Å;
        a second layer formed on the first layer, the second layer comprising silver alloy including silver and at least one first metal selected from a group consisting of the lanthanide series elements and the actinide series elements, the second layer having the thickness of not less than 1,000 Å; and
        a third layer comprising a conducting material on the second layer, the third layer having the thickness of not more than 100 Å;
    an emission layer formed on the first electrode; and
    a second electrode formed on the emission layer.

12. The organic light emitting diode as claimed in claim 11, wherein the silver alloy further contains at least one second metal selected from the Group 11 elements (IB).

13. The organic light emitting diode as claimed in claim 11, wherein the silver alloy contains silver, samarium and at least one of Cu and Au.

14. The organic light emitting diode as claimed in claim 11, wherein the silver alloy further contains terbium.

15. The organic light emitting diode as claimed in claim 11, wherein the silver alloy contains Ag, Sm, Cu, Au, and Tb, and each of the first layer and the third layer is formed of one of Indium Tin Oxide (ITO) and Indium Zinc Oxide (IZO).

16. The organic light emitting diode as claimed in claim 15, wherein the Sm is contained at an atomic percent of 0.1 to 0.6, each of the Th, Au and Cu is contained at an atomic percent of 0.4 to 1.

17. The organic light emitting diode as claimed in claim 11, wherein each thickness of the first layer and the third layer is smaller than the thickness of the second layer.

18. The organic light emitting diode as claimed in claim 11, wherein each of the first layer and the third layer is formed of one of Indium Tin Oxide (ITO) and Indium Zinc Oxide (IZO).

19. An organic light emitting diode, comprising:
a first electrode comprising:
   a first layer comprising metal oxide, the first layer having the thickness of not more than 100 Å;
   a second layer formed on the first layer, the second layer comprising silver alloy including Ag, Sm, Tb, Au and Cu, the second layer having the thickness of not less than 1,000 Å; and
   a third layer comprising metal oxide on the second layer, the third layer having the thickness of not more than 100 Å;
an emission layer formed on the first electrode; and
a second electrode formed on the emission layer.

* * * * *